United States Patent [19]
Lenz et al.

[11] Patent Number: 4,886,942
[45] Date of Patent: Dec. 12, 1989

[54] STRAIN RELIEF STRUCTURE FOR CONNECTING FLAT FLEXIBLE CABLE TO A CIRCUIT BOARD

[75] Inventors: William Lenz, Crestwood; Arvind Patel, Naperville; Thaddeus Tomkiewicz, Woodridge, all of Ill.

[73] Assignee: Molex Incorporated, Del.

[21] Appl. No.: 315,052

[22] Filed: Feb. 24, 1989

[51] Int. Cl.⁴ ............... H02G 15/007; H01R 13/58; H05K 1/18
[52] U.S. Cl. ............................ 174/135; 439/449; 439/493
[58] Field of Search ............... 174/135; 439/449, 456, 439/457, 458, 459, 460, 493

[56] References Cited
U.S. PATENT DOCUMENTS

| 4,385,341 | 5/1983 | Main | 174/135 X |
| 4,611,868 | 9/1986 | Matsui et al. | 174/135 X |
| 4,719,321 | 1/1988 | Kozel et al. | 174/135 |

FOREIGN PATENT DOCUMENTS 3405126  8/1985  Fed. Rep. of Germany ...... 439/493
57-46632 10/1982  Japan .................................. 174/135
63-31490  8/1988  Japan .................................. 174/135

Primary Examiner—Laramie E. Askin
Attorney, Agent, or Firm—Louis A. Hecht; Stephen Z. Weiss

[57] ABSTRACT

A strain relief structure is provided for direct cable to circuit board connections. The strain relief structure is securely mountable to the circuit board and comprises a body which includes at least one cable receiving aperture extending therethrough. The cable receiving aperture is characterized by a deflectable strain relief engagement for engaging the insulation on the cable and providing necessary strain relief. The aperture is constructed to alternatively permit first and second depths of insertion, each of which permits engagement of the strain relief structure with the cable. The first depth of insertion substantially encloses the exposed conductors of the cable to prevent damage during shipment and storage. The second depth of insertion enables electrical connection between the cable conductors and conductive areas on the circuit board.

18 Claims, 3 Drawing Sheets

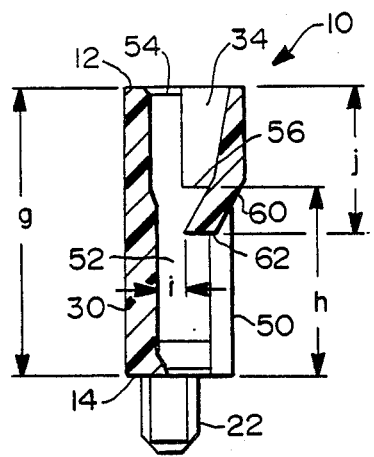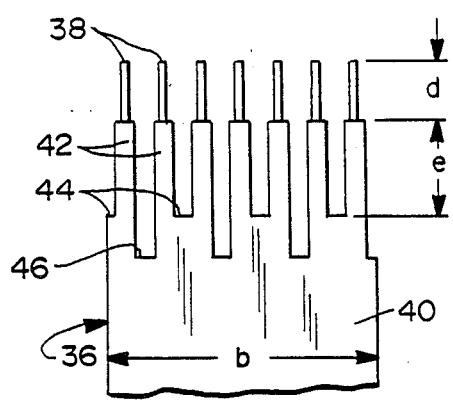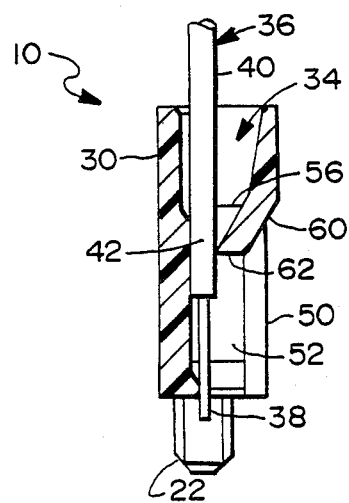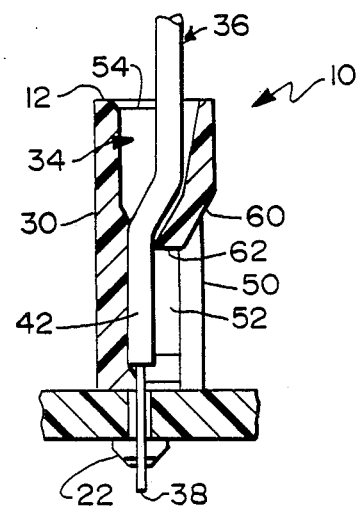
FIG.4
FIG.5
FIG.6
FIG.7

STRAIN RELIEF STRUCTURE FOR CONNECTING FLAT FLEXIBLE CABLE TO A CIRCUIT BOARD

BACKGROUND OF THE INVENTION

Electrical devices often comprise cables which extend from one printed circuit board to another or from a printed circuit board to an electrical component. In many instances the cable is a flat flexible cable having a plurality of generally parallel conductors and a flexible insulation disposed around and between the respective conductors. In some instances an electrical connector with terminals therein is mounted to the printed circuit board, such that the terminals of the connector are electrically connected to the conductive areas on the circuit board. A cable may then be terminated to a second electrical connector which can be mated to the board-mounted connector. Connections of this type are employed when it is necessary to periodically separate the cable from the circuit board. However, these mateable pairs of connectors are relatively expensive and can represent a substantial cost penalty in the highly competitive electronics industry. As a result, it is desirable to directly and permanently connect the conductors of the cable to the conductive areas on the circuit board in situations where periodic disconnection will not be required. This direct connection of the cable to the circuit board can result in substantial cost savings and manufacturing efficiencies. In particular, the respective conductive leads of the cable can be soldered directly to the conductive areas on the circuit board without mateable pairs of terminals and connector housings.

The direct connection of the conductive leads in the cable to the conductive areas on the circuit board must provide for strain relief. In particular, stresses exerted on the cable either during assembly of the electrical apparatus or during use of the apparatus may create strains that could damage the soldered connection between the leads of the cable and the conductive areas on the circuit board.

The prior art includes structures to provide strain relief for direct cable to circuit board electrical connections. For example, Japanese Published Patent Application No. 63-31490 shows a molded strain relief structure for mounting directly to a circuit board. The strain relief structure shown in Japanese examined Utility Model Application No. 63-31490 has opposed elongated top and bottom surfaces with an elongated slot extending therebetween for receiving a prepared end of a flat flexible cable. A plurality of angularly aligned fingers extend into the slot for receiving the flat flexible cable. The strain relief structure of Japanese examined Utility Model Application No. 63-31490 is securely mounted to the circuit board in alignment with a linear array of through holes for receiving the conductive leads of the flat flexible cable. The end of the flat flexible is prepared by removing the insulation around and between the conductors adjacent an end of the cable, and the prepared end of the flat flexible cable is inserted into the slot of the board-mounted strain relief structure. Sufficient insertion of the flat flexible cable into the slot of the board-mounted strain relief structure shown in Japanese examined Utility Model Application No. 63-31490 causes the insulation of the flat flexible cable to be urged into engagement with the deflectable locking fingers of the strain relief structure. The exposed leads of the flat flexible cable then can be soldered to appropriate conductive areas on the circuit board.

The structure shown in Japanese examined Utility Model Application No. 63-31490 is undesirable in that it requires the mounting of the strain relief structure onto the circuit board prior to insertion of the flat flexible cable. In particular, the exposed conductors of the flat flexible cable can be damaged or misaligned prior to or during insertion of the flat flexible cable into the strain relief structure shown in Japanese examined Utility Model Application No. 63-31490. Thus, excessive time could be required to ensure alignment of the exposed conductors of the flat flexible cable prior to insertion into the strain relief structure. An improperly aligned exposed lead may not properly enter the through hole of the circuit board, thereby yielding an incomplete circuit. An attempt to realign the conductive leads after a problem has been identified can be extremely difficult both because of the locking engagement of the strain relief structure with the circuit board and because of the strain relief gripping of the insulation inherent in the structure. An attempt to preassemble the flat flexible cable to the strain relief structure of Japanese examined Utility Model Application No. 63-31490 prior to mounting the structure on the circuit board can result in overinsertion of the flat flexible cable and would not avoid the problem of potential damage to the exposed conductive leads which could occur during mounting of the strain relief structure on the circuit board.

Several strain relief structures have included two separate parts that are sandwiched around the ends of the cable to achieve the required strain relief. Examples of these structures are shown in U.S. Pat. No. 4,719,321 which issued to Kozel et al on Jan. 12, 1988 and German printed Patent Application No. 3405 126 which was published on Aug. 14, 1985. Two-part structures such as these are considered undesirable due to generally higher manufacturing costs, complex assembly and inventory control problems. A variation of these two component strain relief structures is shown in U.S. Pat. No. 4,611,868 which issued to Matsui et al on Sept. 16, 1986, and which includes an integrally molded hinged structure which effectively folds around a cable for achieving strain relief.

In view of the above, it is an object of the subject invention to provide a board-mountable strain relief structure.

Another object of the subject invention is to provide an integrally molded board-mountable strain relief structure for cables.

It is an additional object of the subject invention to provide a strain relief structure that can be mounted to a cable for protecting the exposed leads of the cable prior to mounting the cable and the strain relief structure to a circuit board.

A further object of the subject invention is to provide a strain relief structure that can be securely mounted to a cable in a first position during storage and shipment and that subsequently can lockingly engage a cable in a second position to achieve adequate strain relief between the cable and a circuit board.

Still another object of the subject invention is to provide a strain relief structure that prevents overinsertion of the cable in each of two alternate dispositions on the cable.

Another object of the subject invention is to provide a strain relief structure for ensuring protection and alignment of the leads of a cable prior to mounting on a board and that subsequently ensures proper alignment and strain relief connection of the cable to a circuit board.

SUMMARY OF THE INVENTION

The subject invention is directed to a strain relief structure comprising a body having at least one slot or aperture for receiving a cable therein. The cable may be prepared or stripped prior to insertion into the strain relief structure such that the terminal portions of the conductive leads are exposed for subsequent electrical connection to conductive areas on a circuit board. The cable may be a flat flexible cable having a plurality of conductive leads disposed in a parallel array. The preparation of the end of the flat flexible cable may comprise removing portions of the insulation between the cables for a selected distance from the end of the cable. Thus, the extreme end of the flat flexible cable may have all insulation stripped away such that the uninsulated conductive leads extend from the end of the cable. A portion of the flat flexible cable adjacent the stripped end may include insulation around each individual conductive lead, but with the insulation webs between adjacent leads at least partly removed.

The strain relief structure comprises at least one strain relief means extending into the cable receiving slot or aperture. The strain relief means may be angularly aligned with respect to the direction of insertion to be deflected by the insertion of the cable into the slot or aperture. However, the angular alignment and the configuration of the strain relief means enables engagement of the insulation on the cable to substantially prevent withdrawal of the cable and provide strain relief. The strain relief means may comprise at least one deflectable finger.

The strain relief structure comprises at least one insertion control means in the slot for engaging the cable and defining at least a first depth of insertion of the cable relative to the strain relief structure. More particularly, the insertion control means may be disposed to engage the cable after the strain relief means has engaged the insulation of the cable to prevent separation of the cable from the strain relief structure. The insertion control means is disposed at a position on the strain relief structure such that the exposed conductors at the end of the cable are substantially enclosed and protected by the strain relief structure. Thus, at this first depth of insertion, the strain relief structure simultaneously protects the end of the cable, prevents separation of the cable and initially controls the amount of insertion.

The slot or aperture of the strain relief structure is constructed to enable the cable to be selectively moved into a position where the cable is free from the insertion control means. The movement of the cable out of engagement with the insertion control means enables further insertion of the cable into the strain relief structure. This additional insertion of the cable into the strain relief structure will advance the exposed leads of the cable into a position for electrical connection to conductive areas on the circuit board. The strain relief structure may further comprise at least one second insertion control means for positively defining a second or final depth of insertion of the cable into the strain relief structure.

The strain relief structure of the subject invention can be employed by mounting the cable and the strain relief structure to one another prior to mounting on a circuit board. In particular, the prepared cable and the strain relief structure can be shipped and/or stored in an initially assembled condition prior to mounting of the cable and strain relief structure on a circuit board. In this initial mounted condition, the first insertion control means ensures that the exposed leads of the cable are substantially protected in their properly aligned parallel orientation by the strain relief structure. Additionally, the strain relief means of the structure will have already engaged the cable to prevent unintended separation of the strain relief structure from the cable prior to installation on the circuit board.

The initially assembled cable and strain relief structure then can be securely mounted to the circuit board with the leads of the cable still in a protected properly aligned condition relative to the conductive areas, through holes or other such conductive lead receiving means on the circuit board. Once the strain relief structure has been securely mounted to the circuit board, the cable can be moved free of the first insertion control means and urged more fully into the strain relief structure. This additional movement of the cable will advance each conductive lead of the cable into a position for subsequent electrical connection to conductive areas on the circuit board. The amount of such insertion can be controlled either by the circuit board or by the second insertion control means on the strain relief structure. The strain relief means of the strain relief structure will continue to provide the desired strain relief with the cable in the second relative insertion depth of the cable into the strain relief structure. The strain relief structure of the subject invention thus ensures proper protection and alignment of the exposed conductors both prior to and during installation on the circuit board and greatly facilitates component assembly.

BRIEF DESCRIPTION OF THE DRAWINGS

FIG. 4 is a cross-sectional view taken along line 4—4 in FIG. 3.

FIG. 5 is a top plan view of a flat flexible cable prepared for insertion into the strain relief structure of the subject invention.

FIG. 6 is a cross-sectional view similar to FIG. 4 but showing a cable mounted in a first relative position in the strain relief structure.

FIG. 7 is a cross-sectional view similar to FIGS. 4 and 6 but showing the cable fully inserted in the strain relief structure and mounted to a circuit board.

DETAILED DESCRIPTION OF THE PREFERRED EMBODIMENT

Figure 1:
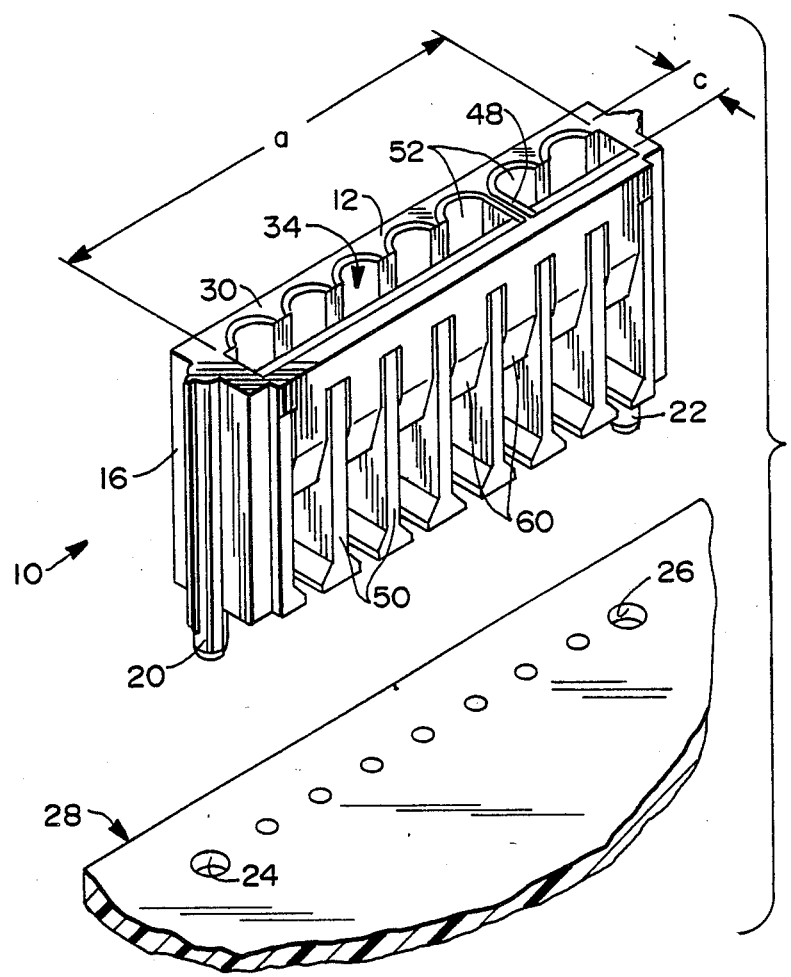
FIG. 1 is an exploded perspective view of the strain relief structure of the subject invention and an associated circuit board.
Figure 2:
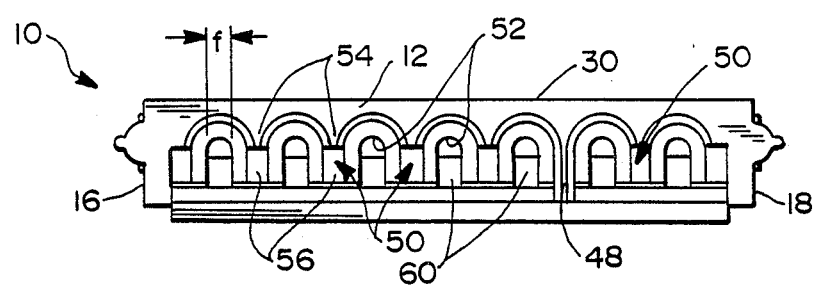
FIG. 2 is a top plan view of the strain relief structure.
Figure 3:
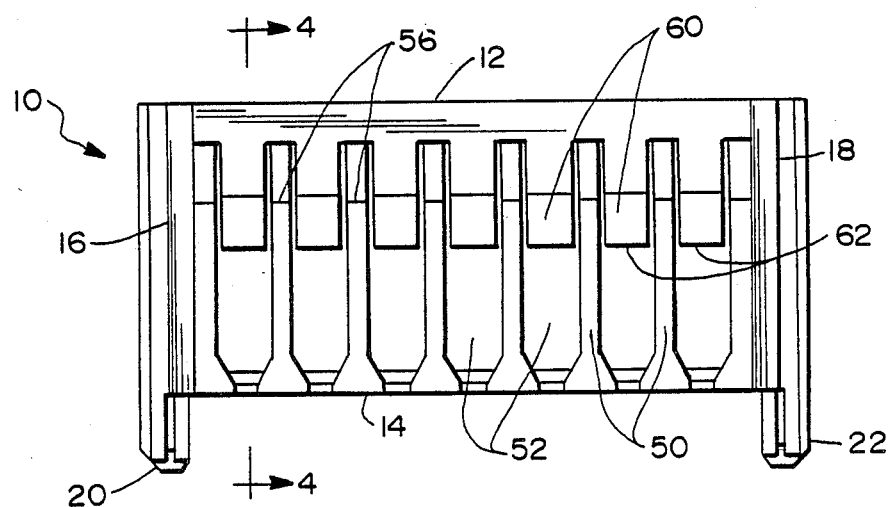
FIG. 3 is a front elevational view of the strain relief structure.

The strain relief structure of the subject invention is identified generally by the numeral 10 in FIGS. 1–4. The strain relief structure 10 is unitarily molded from a plastic material and comprises a body having a top surface 12 and a bottom board-mounting surface 14. Opposed end walls 16 and 18 extend between the top and bottom surfaces 12 and 14. The end walls 16 and 18 are characterized by mounting pegs 20 and 22 which extend beyond the bottom surface 14. Fins on the pegs 20 and 22 will deform to achieve interference fit with appropriately dimensioned apertures 24 and 26 in a printed circuit board 28 to permit secure mounting of the strain relief structure 10 to the printed circuit board 28.

The strain relief structure 10 further comprises a rear wall 30 which extends between the opposed top and bottom surfaces 12 and 14 of the strain relief structure 10 and between the opposed end walls 16 and 18 thereof. The front of the strain relief structure 10 is substantially open in the illustrated embodiment, as explained further herein. However, strain relief structures within the scope of this invention could include a closed front.

A cable receiving aperture indicated generally by the number 34 extends into the top surface 12 of the strain relief structure 10 and toward the bottom board mounting surface 14 thereof. The cable receiving aperture 34 is specifically constructed and dimensioned to receive a flat flexible cable 36 having a plurality of substantially parallel conductive leads 38 disposed within a substantially flexible resilient insulation 40, as shown in FIG. 5. In particular, the cable receiving aperture 34 defines a length "a" slightly greater than the width "b" of the cable 36. The aperture 34 further defines a width "c" which is substantially greater than the thickness of the flat flexible cable 36.

Referring to FIG. 5, the cable 36 is prepared by stripping all insulation from the conductors 38 for a distance "d" from the end. The distance "d" is selected in accordance with the thickness of the circuit board 28 to which the cable 36 is to be terminated. In particular, the distance "d" is selected to ensure that the exposed end of each conductor 38 will extend a sufficient distance into through holes in the circuit board 28 to achieve electrical connection with conductive areas on the circuit board. The cable 36 is further prepared by stripping portions of the insulation 40 intermediate adjacent conductors 38 for a distance "e". Thus, the flat flexible cable 36 is prepared to comprise a plurality of discrete insulated leads 42 extending a distance "e" from the uninsulated portions of the conductors 38. The discrete insulated leads 42 terminate at insulation webs 44 which, as explained below, define stops which help to control the amount of insertion of the cable 36 into the strain relief structure 10 illustrated herein. The long slot 46 in the cable 36 may be provided to accommodate a transverse support 48 which could be incorporated into a long strain relief structure to enhance structural support.

Returning to FIGS. 1–4, the cable receiving aperture 34 of the strain relief structure 10 comprises a plurality of transverse walls 50 which extend orthogonally from the rear wall 30 and function to divide portions of the aperture 34 into cavities for receiving the discrete insulated leads 42 and the exposed conductors 38 of the cable 36. In particular, the distance between adjacent transverse walls 50 is selected to define cavities having a width "f" sufficient to receive the insulated leads 42 of the cable 36.

Each transverse wall 50 is of stepped configuration and defines an upper shoulder 54 generally adjacent the rear wall 30 and the top surface 12 of the strain relief structure 10, and a lower shoulder 56 spaced further from the rear wall 30 and top surface 12. The stepped configuration of the transverse walls 50 enables first and second relative depths of insertion of the cable 36 into the aperture 34 as explained herein. In particular, the upper shoulder 54 defines a first depth of insertion for a cable disposed generally adjacent the rear wall 30 of the structure 10. The lower shoulder 56, on the other hand, defines a second and deeper depth of insertion for a cable rotated or translated toward the open front of the strain relief structure 10. The shoulders 54 and 56 are intended to engage the insulation webs 44 which define stops on the cable 36 as depicted in FIG. 5. More particularly, the depth of insertion "g" into the strain relief structure 10 as defined by the distance between the upper shoulder 54 and the bottom 14 is approximately equal to the distance "d+e" from the insulation web or stop 44 on the cable 36 to the extreme end of the cable 36. Thus, virtually all of each exposed conductor 38 will be enclosed and protected by the strain relief structure 10 when the insulation web 44 of the flat flexible cable 36 is in abutting engagement with the upper shoulder 54.

The lower shoulder 56, on the other hand, is disposed closer to the bottom surface 14 to enable the exposed conductors 38 to extend sufficiently beyond the bottom surface 14 of the strain relief structure 10 for subsequent electrical connection to conductive areas on a circuit board. In particular, the distance "h" between the lower shoulder 56 and the bottom 14 of the strain relief structure 10 is substantially less than the distance "d+e" representing the distance between the insulation web 44 on the cable 36 and the extreme end of the cable 36.

The open front of the strain relief structure 10 is characterized by deflectable fingers 60 which are cantilevered from the top 12 into each respective cavity 52. The fingers 60 are aligned at an angle of approximately 30° to the direction of insertion and terminate at points 62 which define the narrowest front-to-rear dimension of each cavity 52. More particularly, the distance "i" between the rear wall 30 and the point 62 on each finger 60 is less than the thickness of the discrete insulated portions 42 of the flat flexible cable 36. The distance "j" between the upper shoulder 54 and the point 62 on the finger 60 is less than the length "e" of the discrete insulated leads 42. Thus, when the cable 36 is inserted into the aperture 34 such that the insulation web 44 thereof is engaged against the upper shoulder 54, the point 62 of each finger 60 will grippingly engage the insulation 40 of the cable 36.

The use of the strain relief structure 10 can be best illustrated with reference to FIGS. 5–7. In particular, the flat flexible cable 36 is stripped and prepared substantially as shown in FIG. 5. The prepared end of the cable 36 is then inserted into the cable receiving aperture 34 of the strain relief structure 10 prior to mounting the strain relief structure 10 onto the circuit board 28, and typically prior to shipping the prepared cable 36 and strain relief structure 10 to a location for assembly onto a circuit board. The cable 36 is generally aligned parallel to and adjacent the rear wall 30 of the strain relief structure 10 during this initial insertion. Thus, as shown in FIG. 6, the insulation web 44 on the cable 36 will be urged into abutment with the upper shoulder 54 to define an initial maximum depth of insertion. In this initial orientation of the cable 36 relative to the strain relief structure 10, as shown in FIG. 6, the exposed conductors 38 will lie substantially within the cavities 52. Any minor extension of the conductors 38 beyond the cavities 52 will be protected intermediate the mounting structures 20 and 22. As noted above, distance "j" between the upper shoulder 54 and the point 62 is less than the length "e" of the discrete insulated portions 42 on the cable 36. As a result, the point 62 of each finger 60 will grippingly engage the insulation 40 on the cable 36 to prevent unintended separation of the strain relief structure 10 from the cable 36 during periods of shipment or storage.

The flat flexible cable 36 is advanced into the FIG. 7 orientation within the strain relief structure 10 at the location of the component assembly. In particular, the FIG. 7 orientation can be achieved either immediately prior to mounting the strain relief structure 10 onto the circuit board 28 or sometime after the mounting of the strain relief structure 10 onto the circuit board 28. The FIG. 7 orientation of the cable is achieved by merely rotating or displacing the cable 36 away from the rear wall 30 of the strain relief structure 10. This forward movement of the cable 36 enables the stops 44 thereof to clear the upper shoulder 54, thereby permitting further insertion of the cable 36 into the cable receiving aperture 34. In the FIG. 7 orientation, the points 62 of the fingers 60 will continue their locking engagement with the insulation 40 on the cable 36, thereby preventing withdrawal of the cable 36 and providing the required strain relief. The depth of insertion of the cable 36 relative to the strain relief structure 10 and the circuit board 28 is controlled by engagement of the insulation web 44 on the cable 36 with the lower shoulders 56. Consequently, overinsertion of the cable 36 in the FIG. 7 orientation is positively prevented.

In summary, a strain relief structure is provided for mounting to a flat flexible cable. The strain relief structure comprises a body having a cable receiving aperture having a plurality of transverse walls to divide the aperture into separate cavities for receiving the prepared ends of the flat flexible cable. The transverse walls are of stepped configuration. The stepped configuration defines upper and lower shoulders for defining first and second depths of insertion of the cable into the strain relief structure. The first depth of insertion is selected to substantially enclose the stripped and exposed conductive leads of the cable for protecting the cable end during periods of shipment and storage. The lower shoulder defines a depth of insertion substantially corresponding to the depth required for connecting the leads to conductive areas on a circuit board. The strain relief structure further comprises at least one deflectable finger for engaging the insulation on the cable and providing necessary strain relief. The finger is disposed to engage the insulation both at the first and at the second relative depths of insertion.

While the invention has been described with respect to a preferred embodiment, it is apparent that various changes can be made without departing from the scope of the invention as defined by the appended claims. For example, other strain relief means may be provided for engaging the insulation. Additionally, the lower shoulder may be substantially or entirely eliminated with the second depth of insertion being defined by engagement of the cable insulation with the circuit board.

We claim:

1. A strain relief structure for connecting a flat flexible cable to a circuit board, said flat flexible cable comprising an array of parallel conductors, flexible insulation disposed around said conductors and webs of insulation disposed between the conductors in said array, one end of said cable being prepared by removing portions of the webs of insulation between adjacent conductors for a selected length from the end of said cable, said strain relief structure comprising a body having at least one cable receiving aperture extending therethrough, at least one strain relief means adjacent said aperture for engaging the insulation on the cable, at least one transverse wall extending into said aperture, said transverse wall comprising at least one insertion control means for engaging the web of insulation between the conductors of said cable for defining a first depth of insertion of said cable into said strain relief structure, said cable receiving aperture being configured to enable said cable to be moved out of engagement with said insertion control means for permitting a second depth of insertion of said cable into said strain relief structure, whereby said first depth of insertion enables said strain relief structure to protect the end of the cable and whereby said second depth of insertion enables connection of said cable to the circuit board.

2. A strain relief structure as in claim 1 further comprising means on said body for lockingly mounting said body to a printed circuit board.

3. A strain relief structure as in claim 1 wherein said strain relief means comprises at least one deflectable finger extending into the cable receiving aperture of said strain relief structure for grippingly engaging the insulation on the cable.

4. A strain relief structure as in claim 3 wherein said finger extends at an acute angle into the cable receiving aperture.

5. A strain relief structure as in claim 4 wherein said finger terminates at a point disposed within the cable receiving aperture, said point being grippingly engageable with the insulation on the cable.

6. A strain relief structure as in claim 1 wherein said transverse wall is of stepped configuration, said insertion control means defining a first shoulder in the stepped transverse wall, said stepped transverse wall further comprising a second shoulder for controlling the second depth of insertion, said first and second shoulders being spaced from said strain relief means a distance less than the selected length at said end of said cable having the insulation web removed therefrom.

7. A strain relief structure as in claim 6 wherein said first shoulder is disposed such that the end of said cable is substantially enclosed within said strain relief structure when the web of insulation between the conductors thereof is in engagement with said first shoulder.

8. A strain relief structure as in claim 6 wherein said second shoulder is disposed such that the end of said cable extends beyond said strain relief structure when the web of insulation between the conductors thereof is in engagement with the second shoulder.

9. A strain relief structure as in claim 1 unitarily molded from a plastic material.

10. A strain relief structure for strain relief connection between a flat flexible cable and a circuit board, said strain relief structure comprising a body having a bottom surface for mounting on a circuit board, a top spaced from said bottom surface, a rear wall and opposed end walls extending between and connecting said top and said bottom surface, said strain relief structure comprising at least one cable receiving aperture extending between the top and the bottom surface thereof for receiving the flat flexible cable therein, at least one deflectable strain relief finger extending into the cable receiving aperture, at least one transverse wall extending into the cable receiving aperture of said strain relief structure from the rear wall thereof, said transverse wall being of stepped configuration and defining a first shoulder and a second shoulder intermediate said first shoulder and the bottom surface of said strain relief structure, said first shoulder being disposed to engage the flat flexible cable in a first relative position of said cable in said strain relief structure such that the end of said cable is substantially enclosed and protected by said strain relief structure, said second shoulder being disposed to engage said cable in a second relative position for enabling connection of said cable to the circuit board.

11. A strain relief structure as in claim 10 further comprising means on said body for mounting said body to the circuit board.

12. A strain relief structure as in claim 10 unitarily molded from a plastic material.

13. A strain relief structure as in claim 10 wherein said first shoulder of said transverse wall is disposed generally adjacent the rear wall and the top of said strain relief structure, said second shoulder being disposed at a location spaced from said rear wall and said top.

14. A strain relief structure as in claim 13 wherein said first and second shoulders are disposed intermediate the top of the strain relief structure and the finger thereof.

15. A strain relief structure for achieving strain relief connection between a flat flexible cable and a circuit board, said strain relief structure comprising: a body having,
   aperture means for receiving the cable;
   strain relief means for engaging the cable and preventing removal of the cable from the strain relief structure;
   a first insertion control means for defining a first depth of insertion of said cable into said strain relief structure, said first insertion control means being constructed to permit selective disengagement of said cable from said first insertion control means; and
   a second insertion control means defining a second depth of insertion of said cable into said strain relief structure.

16. A strain relief structure as in claim 15 wherein said first and second insertion control means are disposed to engage the cable after at least a portion of the cable has been engaged by the strain relief means.

17. A strain relief structure as in claim 15 further comprising board mounting means on said body for lockingly mounting said body to the circuit board.

18. A strain relief structure as in claim 15 of unitary molded plastic construction.

* * * * *